United States Patent
Chen et al.

(10) Patent No.: US 10,825,599 B2
(45) Date of Patent: Nov. 3, 2020

(54) CARRIER STRUCTURE

(71) Applicant: Unimicron Technology Corp., Taoyuan (TW)

(72) Inventors: Chang-Fu Chen, Taoyuan (TW); Chun-Hao Chen, New Taipei (TW); Kuan-Hsi Wu, Taoyuan (TW); Pi-Te Pan, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 292 days.

(21) Appl. No.: 15/818,773

(22) Filed: Nov. 21, 2017

(65) Prior Publication Data
US 2019/0088401 A1  Mar. 21, 2019

(30) Foreign Application Priority Data
Sep. 15, 2017  (TW) .............................. 106131670 A

(51) Int. Cl.
*H01F 27/28* (2006.01)
*H01F 27/24* (2006.01)
(Continued)

(52) U.S. Cl.
CPC ......... *H01F 27/2804* (2013.01); *H01F 5/003* (2013.01); *H01F 17/0006* (2013.01); *H01F 17/04* (2013.01); *H01F 27/24* (2013.01); *H01L 23/5227* (2013.01); *H05K 1/111* (2013.01); *H05K 1/165* (2013.01); *H01F 2017/0073* (2013.01); *H01F 2017/0086* (2013.01); *H01F 2027/2819* (2013.01); *H05K 2201/086* (2013.01); *H05K 2201/09272* (2013.01)

(58) Field of Classification Search
None
See application file for complete search history.

(56) References Cited

U.S. PATENT DOCUMENTS

| 2002/0050626 A1* | 5/2002 | Onuma | ............... H01F 17/0006 257/531 |
| 2004/0090299 A1* | 5/2004 | Gijs | .................... H01F 17/0006 336/200 |

(Continued)

FOREIGN PATENT DOCUMENTS

| CN | 101038880 | 9/2007 |
| CN | 202503818 | 10/2012 |

(Continued)

OTHER PUBLICATIONS

"Office Action of China Counterpart Application," dated Jan. 20, 2020, p. 1-p. 6.

*Primary Examiner* — Shaun M Campbell
*Assistant Examiner* — Aneta B Cieslewicz
(74) *Attorney, Agent, or Firm* — JCIPRNET

(57) ABSTRACT

A carrier structure includes a substrate, a first patterned circuit layer and at least one magnetic element. The substrate has a first surface and an opening passing through the substrate. The first patterned circuit layer is disposed on the first surface of the substrate and includes an annular circuit for generating an electromagnetic field. The magnetic element is disposed within the opening of the substrate, wherein the magnetic element couples the annular circuit and acts in response to the magnetic force of the electromagnetic field.

9 Claims, 3 Drawing Sheets

(51) Int. Cl.
*H05K 1/11* (2006.01)
*H05K 1/16* (2006.01)
*H01F 17/04* (2006.01)
*H01F 17/00* (2006.01)
*H01F 5/00* (2006.01)
*H01L 23/522* (2006.01)

(56) References Cited

U.S. PATENT DOCUMENTS

| | | | |
|---|---|---|---|
| 2008/0278275 A1* | 11/2008 | Fouquet | H01F 27/2804 336/84 M |
| 2009/0153283 A1 | 6/2009 | Fouquet et al. | |
| 2015/0061817 A1* | 3/2015 | Lee | H01F 17/0033 336/221 |
| 2016/0155559 A1* | 6/2016 | Chiu | H01L 23/645 336/200 |
| 2018/0342342 A1* | 11/2018 | Taniguchi | H01F 17/0033 |

FOREIGN PATENT DOCUMENTS

| | | |
|---|---|---|
| CN | 104602451 | 5/2015 |
| TW | 436822 | 5/2001 |
| TW | M466414 | 11/2013 |

* cited by examiner

//  CARRIER STRUCTURE

CROSS-REFERENCE TO RELATED APPLICATION

This application claims the priority benefit of Taiwan application serial no. 106131670, filed on Sep. 15, 2017. The entirety of the above-mentioned patent application is hereby incorporated by reference herein and made a part of this specification.

BACKGROUND OF THE INVENTION

Field of the Invention

The invention relates to a carrier structure and more particularly, to a carrier structure embedded with a magnetic element.

Description of Related Art

Generally speaking, a circuit carrier requires a design of an annular circuit for generating an electromagnetic field. In order to increase a magnetic force action of the electromagnetic field, magnetic elements have to be additionally disposed over and/or under the annular circuit in a built-up manner. In this way, an overall thickness of the circuit carrier would be increased, which cannot satisfy requirements for miniaturization.

SUMMARY OF THE INVENTION

The invention provides a carrier structure having an inductance effect and a thinner thickness.

A carrier structure of the invention includes a substrate, a first patterned circuit layer and at least one magnetic element. The substrate has a first surface and at least one opening passing through the substrate. The first patterned circuit layer is disposed on the first surface of the substrate and includes an annular circuit configured to generate an electromagnetic field. The magnetic element is disposed within the opening of the substrate. The magnetic element couples the annular circuit and acts in response to a magnetic force of the electromagnetic field.

In an embodiment of the invention, the carrier structure further includes a first solder resist layer disposed on the first surface of the substrate and covering the first surface and a part of the first patterned circuit layer, so as to define a plurality of first pads.

In an embodiment of the invention, the first patterned circuit layer further includes a plurality of peripheral lines, a top position of the opening is located between the peripheral lines and the annular circuit. The first solder resist layer covers the first surface, the annular circuit and a part of the peripheral lines and exposes a part of the peripheral lines, so as to define the first pads.

In an embodiment of the invention, the substrate further has a second surface opposite to the first surface, the opening communicates the first surface with the second surface, and a top position of the opening is located beside at least one side of the annular circuit.

In an embodiment of the invention, the carrier structure further includes a second patterned circuit layer disposed on the second surface of the substrate.

In an embodiment of the invention, the carrier structure further includes a second solder resist layer disposed on the second surface of the substrate and covering a part of the second surface and a part of the second patterned circuit layer. The second solder resist layer exposes a part of the second patterned circuit layer, so as to define a plurality of second pads.

In an embodiment of the invention, the carrier structure further includes an insulating material layer disposed within the opening of the substrate and located between the magnetic element and the substrate.

In an embodiment of the invention, an upper surface and a lower surface insulating material layer are respectively not higher than a top surface and a bottom surface of the magnetic element.

In an embodiment of the invention, the annular circuit is a spiral circuit.

In an embodiment of the invention, the spiral circuit includes a square spiral circuit or a circular spiral circuit.

Based on the above, in the design of the carrier structure of the invention, the at least one magnetic element is disposed within the at least one opening of the substrate, couples the annular circuit of the first patterned circuit layer located on the first surface of the substrate and acts in response to the magnetic force of the electromagnetic field generated by the annular circuit. By being compared with the related art where the magnetic elements are additionally disposed in the built-up manner, the carrier structure of the invention can have the inductance effect and the thinner thickness through the embedded magnetic element in coordination with the annular circuit.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
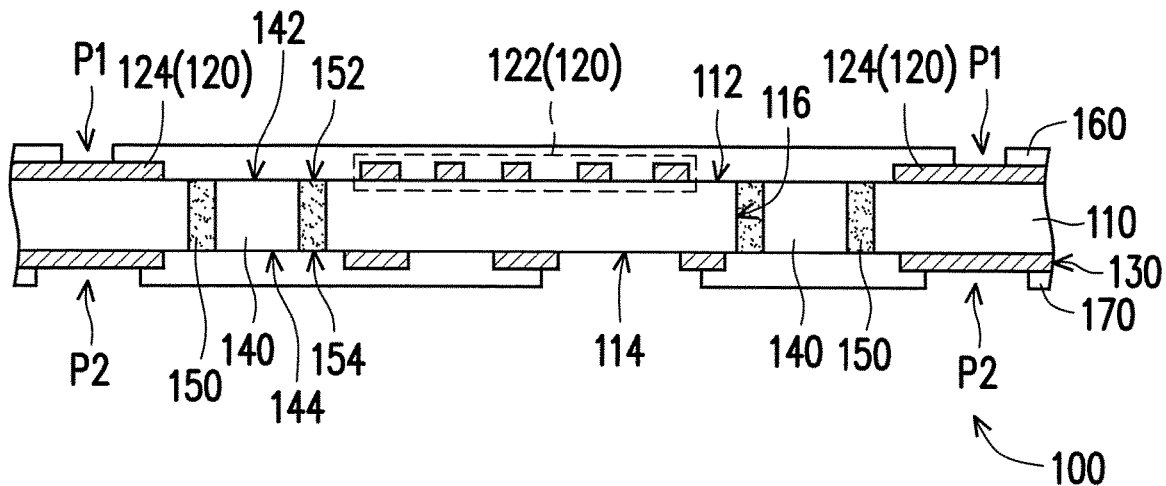
FIG. 1A is a schematic cross-sectional view illustrating a carrier structure according to an embodiment of the invention.
Figure 1B:
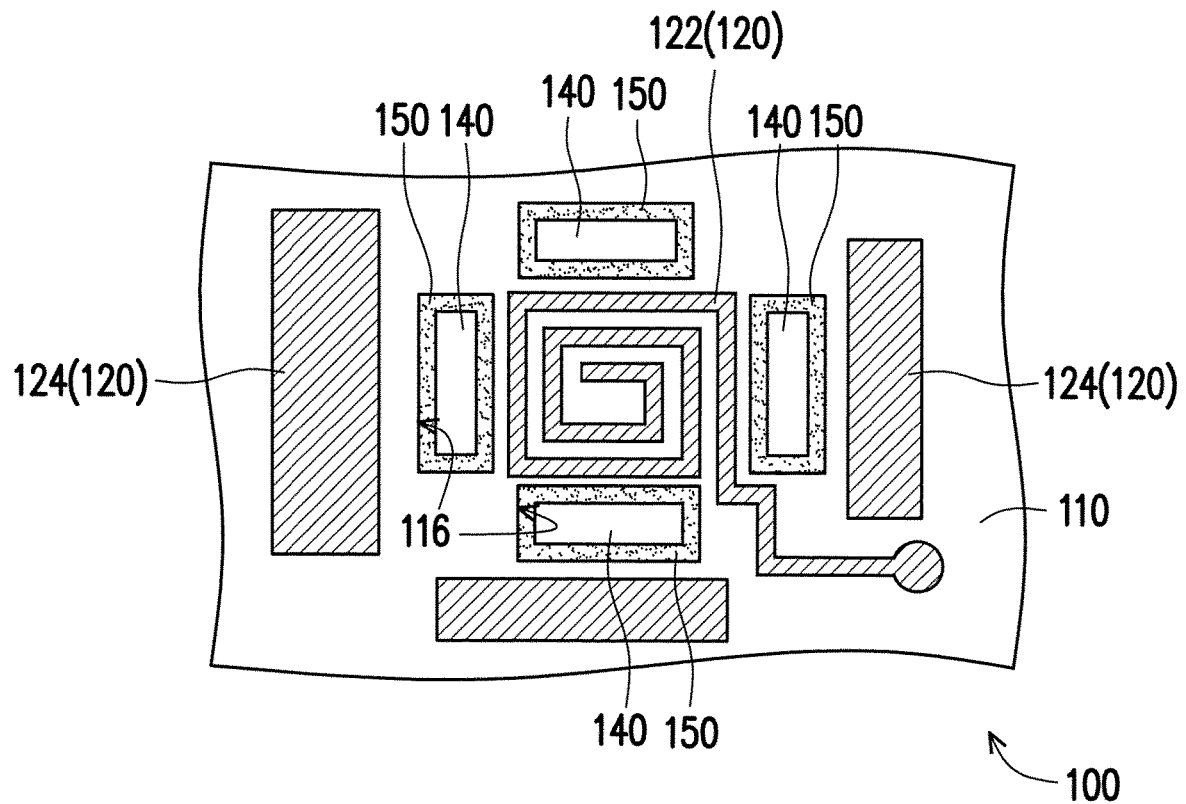
FIG. 1B is a schematic top view illustrating a part of the carrier structure depicted in FIG. 1A.

FIG. 1A is a schematic cross-sectional view illustrating a carrier structure according to an embodiment of the invention. FIG. 1B is a schematic top view illustrating a part of the carrier structure depicted in FIG. 1A. FIG. 2A to FIG. 2D are schematic views illustrating a manufacturing method of the carrier structure depicted in FIG. 1A. For descriptive convenience, a part of components, such as a first solder resist layer, is omitted in FIG. 1B.

Referring to FIG. 1A and FIG. 1B simultaneously, a carrier structure 100 of the present embodiment includes a substrate 110, a first patterned circuit layer 120 and at least one magnetic element 140 (schematically illustrated as four magnetic elements in FIG. 1B). The substrate 110 has a first surface 112 and at least one opening 116 (schematically illustrated as four openings in FIG. 1B) passing through the substrate 110. The first patterned circuit layer 120 is disposed on the first surface 112 of the substrate 110 and includes an annular circuit 122 configured to generate an electromagnetic field. The magnetic element 140 is disposed within the opening 116 of the substrate 110. The magnetic element 140 couples the annular circuit 122 and acts in response to a magnetic force of the electromagnetic field.

Specifically, the substrate 110 of the present embodiment further has a second surface 114 opposite to the first surface 112, and the opening 116 passes through the substrate 110 and communicates the first surface 112 with the second surface 114. In this case, the substrate 110 is, for example, an insulation substrate which is made of a prepreg (PP), an ajinomoto build-up film (ABF) resin or a photoresist material, but the invention is not limited thereto.

Furthermore, the first patterned circuit layer 120 of the present embodiment further includes a plurality of peripheral lines 124. The annular circuit 122 and the peripheral lines 124 are together disposed on the first surface 112 of the substrate 110 to expose a part of the first surface 112, and the peripheral lines 124 are located in the periphery of the annular circuit 122. As illustrated in FIG. 1B, a top position of the opening 116 is located between the peripheral lines 124 and the annular circuit 122. Namely, an orthogonal projection of the opening 116 on a plane (not shown) does not overlap orthogonal projections of the annular circuit 122 and the peripheral lines 124 on the plane at all. In this case, the annular circuit 122 is, for example, a spiral circuit, where the spiral circuit is embodied as a square spiral circuit. Certainly, in other embodiments which are not shown, the spiral circuit may also be a circular spiral circuit, which is not limited in the invention. As illustrated in FIG. 1A, the carrier structure 100 of the present embodiment further includes a second patterned circuit layer 130 disposed on the second surface 114 of the substrate 110, where the second patterned circuit layer 130 exposes a part of the second surface 114 of the substrate 110.

In addition, the magnetic element 140 of the present embodiment is disposed within the opening 116 of the substrate 110. A top surface 142 and a bottom surface 144 of the magnetic element 140 are respectively aligned with or slightly lower than the first surface 112 and the second surface 114 of the substrate 110. Namely, the magnetic element 140 pertains to an embedded structure. In order to effectively fix the magnetic element 140, the carrier structure 100 of the present embodiment further includes an insulating material layer 150 disposed within the opening 116 of the substrate 110 and located between the magnetic element 140 and the substrate 110. Preferably, an upper surface 152 and a lower surface 154 of the insulating material layer 150 are respectively not higher than the top surface 142 and the bottom surface 144 of the magnetic element 140. In other words, the insulating material layer 150 is not extended to the first surface 112 or the second surface 114 of the substrate 110.

In addition, the carrier structure 100 of the present embodiment further includes a first solder resist layer 160 disposed on the first surface 112 of the substrate 110 and covering the first surface 112, the annular circuit 122 and a part of the peripheral lines 124. The first solder resist layer 160 exposes a part of the peripheral lines 124, so as to define a plurality of first pads P1. Additionally, the carrier structure 100 of the present embodiment further includes a second solder resist layer 170 disposed on the second surface 114 of the substrate 110 and covering a part of the second surface 114 and a part of the second patterned circuit layer 130. The second solder resist layer 170 exposes a part of the second patterned circuit layer 130, so as to a plurality of second pads P2. In this case, the carrier structure 100 may be electrically connected to an external circuit through the first pads P1 and the second pads P2.

Figure 2A:
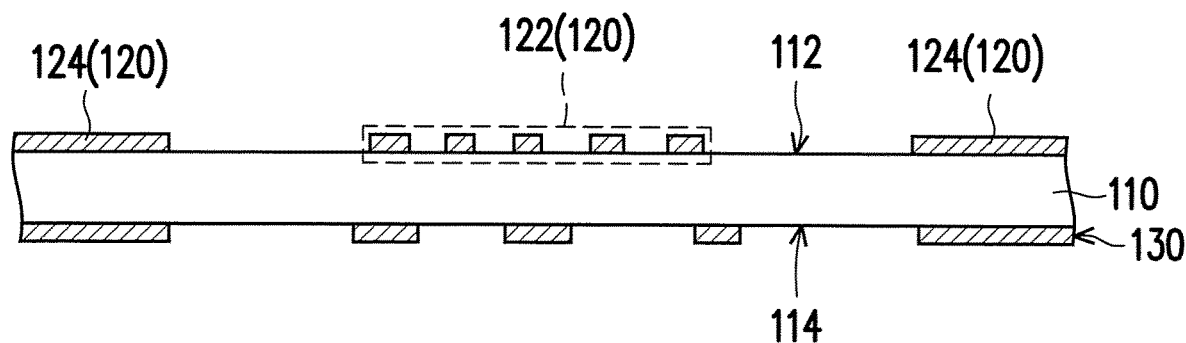
FIG. 2A to FIG. 2D are schematic views illustrating a manufacturing method of the carrier structure depicted in FIG. 1A.

Regarding a manufacturing process, first referring to FIG. 2A, a substrate 110 is first provided. The substrate 110 has a first surface 112 and a second surface 114 opposite to each other. Then, a first patterned circuit layer 120 and a second patterned circuit layer 130 are respectively formed on the first surface 112 and the second surface 114 of the substrate 110. The first patterned circuit layer 120 includes an annular circuit 122 and peripheral lines 124 surrounding the annular circuit 122. The annular circuit 122 and the peripheral lines 124 expose a part of the first surface 112 of the substrate 110. A pattern of the second patterned circuit layer 130 partially corresponds to a pattern of the first patterned circuit layer 120 (e.g., the peripheral lines 124) and expose a part of the second surface 114 of the substrate 110.

Figure 2B:
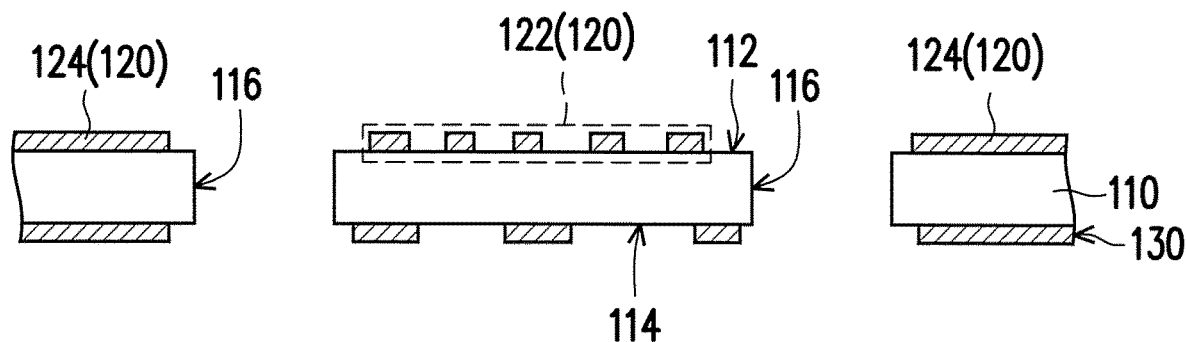

Then, referring to FIG. 2B, an opening 116 passing through the substrate 110 is formed. The opening 116 communicates the first surface 112 with the second surface 114, a top position of the opening 116 is located between the annular circuit 122 and the peripheral lines 124, which may refer to FIG. 1B.

Figure 2C:
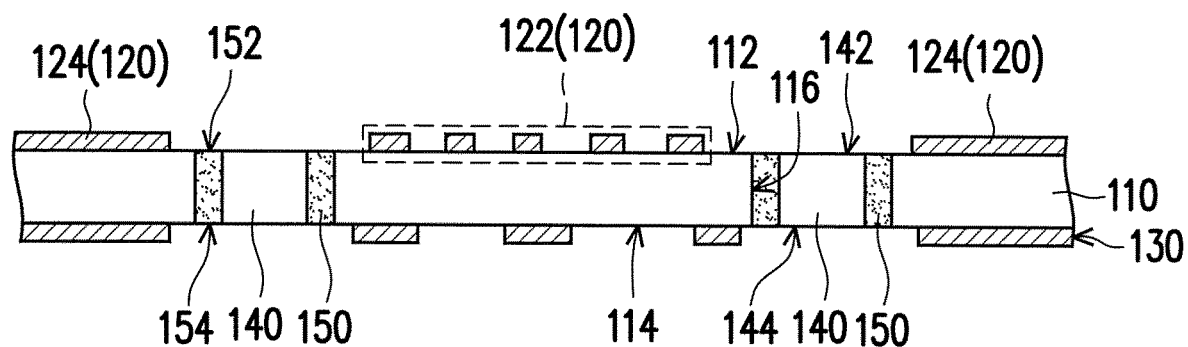

Afterwards, referring to FIG. 2C, a magnetic element 140 is disposed within the opening 116 of the substrate 110. The magnetic element 140 is fixed to the opening 116 of the substrate 110 through an insulating material layer 150. In this case, a top surface 142 and a bottom surface 144 of the magnetic element 140 are respectively aligned with or slightly lower than the first surface 112 and the second surface 114 of the substrate 110. Namely, the magnetic element 140 pertains to an embedded structure. The insulating material layer 150 is located between the magnetic element 140 and the substrate 110. An upper surface 152 and a lower surface 154 of the insulating material layer 150 are respectively not higher than the top surface 142 and the bottom surface 144 of the magnetic element 140.

Figure 2D:
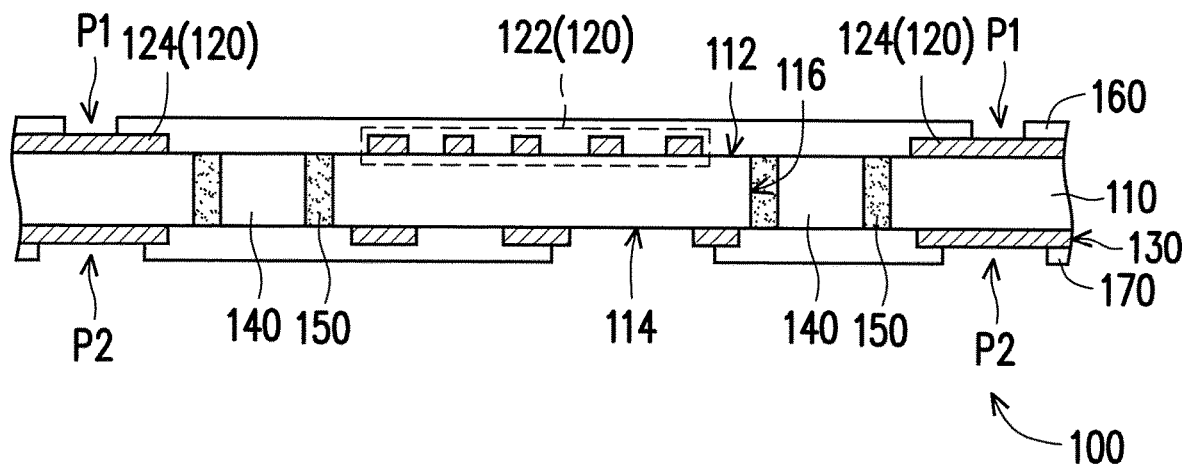

Lastly, referring to FIG. 2D, a first solder resist layer 160 and a second solder resist layer 170 are respectively formed on the first surface 112 and the second surface 114 of the substrate 110. The first solder resist layer 160 covers the first surface 112, the annular circuit 122 and a part of the peripheral lines 124 and exposes a part of the peripheral lines 124, so as to define first pads P1. The second solder resist layer 170 covers a part of the second surface 114 and a part of the second patterned circuit layer 130 and exposes a part of the second patterned circuit layer 130, so as to define second pads P2. Up to this step, the manufacturing of the carrier structure 100 is completed.

In light of the foregoing, in the design of the carrier structure of the invention, the at least one magnetic element is disposed within the at least one opening of the substrate, couples the annular circuit of the first patterned circuit layer located on the first surface of the substrate and acts in response to the magnetic force of the electromagnetic field generated by the annular circuit. By being compared with the related art where the magnetic elements are additionally disposed in the built-up manner, the carrier structure of the invention can have the inductance effect and the thinner thickness through the embedded magnetic element in coordination with the annular circuit.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A carrier structure, comprising:
  a substrate, having a first surface, a second surface opposite to the first surface and at least one opening passing through the substrate;
  a first patterned circuit layer, disposed on the first surface of the substrate and comprising a plurality of peripheral lines and an annular circuit configured to generate an electromagnetic field;
  at least one magnetic element, disposed within the at least one opening of the substrate, wherein the at least one magnetic element couples the annular circuit and acts in response to a magnetic force of the electromagnetic field; and
  an insulating material layer, disposed within the at least one opening of the substrate and located between the at least one magnetic element and the substrate,
  wherein an upper surface and a lower surface of the insulating material layer are respectively not higher than the first surface and the second surface of the substrate,
  wherein a top position of the at least one opening is located between at least one peripheral line of the plurality of peripheral lines and the annular circuit.

2. The carrier structure according to claim 1, further comprising:
  a first solder resist layer, disposed on the first surface of the substrate and covering the first surface and a part of the first patterned circuit layer, so as to define a plurality of first pads.

3. The carrier structure according to claim 2, wherein the first solder resist layer covers the first surface, the annular circuit and a part of the plurality of peripheral lines and exposes a part of the plurality of peripheral lines, so as to define the plurality of first pads.

4. The carrier structure according to claim 1, the at least one opening communicates the first surface with the second surface, and a top position of the at least one opening is located beside at least one side of the annular circuit.

5. The carrier structure according to claim 4, further comprising:
  a second patterned circuit layer, disposed on the second surface of the substrate.

6. The carrier structure according to claim 5, further comprising:
  a second solder resist layer, disposed on the second surface of the substrate, covering a part of the second surface and a part of the second patterned circuit layer and exposing a part of the second patterned circuit layer, so as to define a plurality of second pads.

7. The carrier structure according to claim 1, wherein the upper surface and the lower surface of the insulating material layer are respectively not higher than a top surface and a bottom surface of the at least one magnetic element.

8. The carrier structure according to claim 1, wherein the annular circuit is a spiral circuit.

9. The carrier structure according to claim 8, wherein the spiral circuit includes a square spiral circuit or a circular spiral circuit.

* * * * *